United States Patent [19]

Kung

[11] Patent Number: 4,490,631
[45] Date of Patent: Dec. 25, 1984

[54] TOTEM POLE/OPEN COLLECTOR SELECTABLE OUTPUT CIRCUIT

[75] Inventor: David Kung, San Jose, Calif.

[73] Assignee: National Semiconductor Corporation, Santa Clara, Calif.

[21] Appl. No.: 412,638

[22] Filed: Aug. 30, 1982

[51] Int. Cl.³ ................ H03K 19/088; H03K 19/092; H03K 19/20

[52] U.S. Cl. .................................. 307/456; 307/254; 307/466

[58] Field of Search ............... 307/443, 473, 456–458, 307/465–466, 475, 254, 270

[56] References Cited

U.S. PATENT DOCUMENTS 4,199,731 4/1980 Taylor et al. ...................... 307/456
4,287,433 9/1981 Goodspeed ........................ 307/456
4,339,675 7/1982 Ramsey .............................. 307/456

OTHER PUBLICATIONS

Mrazek, "Tri-State Logic in High-Speed Memories of Microprogrammed Computers" National Semiconductor Corp. publication, Jul., 1971, pp. 1–6.

Primary Examiner—Stanley D. Miller
Assistant Examiner—David R. Hudspeth
Attorney, Agent, or Firm—Gail W. Woodward; Paul J. Winters; Michael J. Pollock

[57] ABSTRACT

A Schottky driver is disclosed in which the output circuitry is pin selectable totem pole or open collector configuration. Means for reduced propagation delay are present along with means for reducing totem pole current spikes and overall current drain.

6 Claims, 2 Drawing Figures

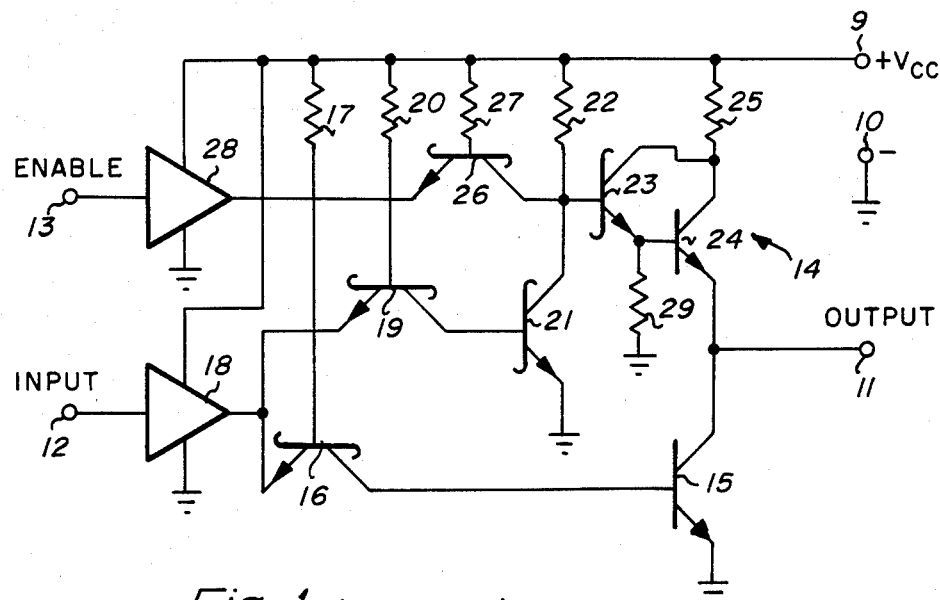
*Fig_1* (PRIOR ART)
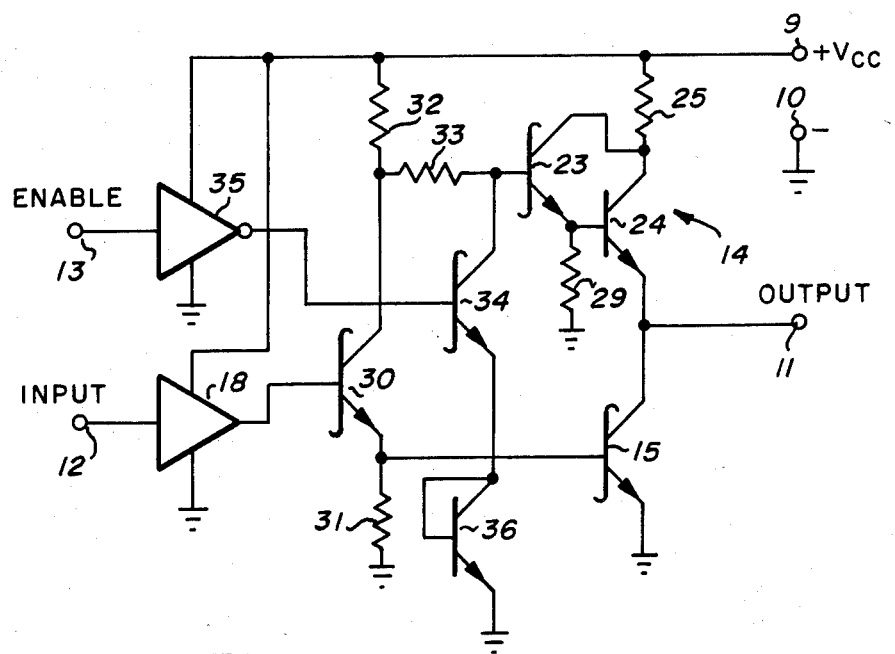
*Fig_2*

TOTEM POLE/OPEN COLLECTOR SELECTABLE OUTPUT CIRCUIT

BACKGROUND OF THE INVENTION

In digital circuits the nature of the output circuit is determined by the nature of the load element. Where the load element can be or is returned to a source of operating power the driver circuit may simply be the open collector of a switched transistor. However where the load element does not include a return to a source of power the driver circuit must include an active output terminal pull up device. Such a configuration involving both a transistor current sink pull down and an active pull up device is commonly referred to as a totem pole circuit. In general a totem pole output circuit has a low output impedance in the logic high state which optimizes transmission speed and device fan out. Open collector output is necessary where more than one device is used to send information over a common bus at the same time.

IEEE standard 488-1978 relates to a GENERAL PURPOSE INTERFACE BUS (GPIB) It describes a high speed system and requires that the driver output stage be pin selectable for either open collector or totem pole operation. The invention relates to devices suitable for integrated circuit (IC) drivers that meet the recommended standards.

SUMMARY OF THE INVENTION

It is an object of the invention to provide an output circuit that can be switched between totem pole and open collector configurations in response to an enable logic signal and which has high speed.

It is a further object of the invention to provide a simplified IC capable of responding to an enable control signal to switch its operation between totem pole and open collector modes wherein efficient use of operating current is realized.

It is a still further object of the invention to provide a reduced current spike in a switchable totem pole/open collector output digital interface circuit when in the totem pole mode.

It is a still further object of the invention to provide a simplified digital logic IC capable of responding to an enable control signal to switch its operation between totem pole and open collector modes.

These and other objects are achieved in a circuit configured as follows. An output stage is composed of a common emitter transistor that has a totem pole pull up collector load device. The common emitter transistor and pull up are driven in phase opposition from a driver that is in turn driven from an input buffer. An enable circuit driven from an enable input is coupled to the pull up so that in one enable state the pull up is active to produce totem pole operation. In the other enable input state the pull up will be disabled so that the open collector output mode is operative.

BRIEF DESCRIPTION OF THE DRAWING

FIG. 1 is a schematic diagram of a prior art circuit.
FIG. 2 is a schematic diagram of the circuit of the invention.

DESCRIPTION OF THE PRIOR ART

FIG. 1 shows the closest known prior art circuit in schematic diagram form.

A source of operating potential $V_{cc}$ is connected between + terminal 9 and − terminal 10 which is grounded. The output signal appears at terminal 11 in response to the input at terminal 12. Enable terminal 13 is used to invoke an output pull up circuit 14. When terminal 13 is low the pull up 14 is disabled so that an open collector transistor output mode is available. When terminal 13 is held high pull up 14 will be operative and a totem pole output mode is available.

Transistor 15 is the normal output device which acts as a current sink to terminal 11 when turned on. Transistor 15 is driven via transistor 16 which operates in the common base configuration. Input terminal 12 is coupled via buffer 18 to the emitter of transistor 16. When the input signal drives the emitter of transistor 16 close to ground, for a logic zero state, resistor 17 will control the base current of transistor 16 which thereby is driven towards saturation. This holds the base of transistor 15 close to ground so that it is off. At the same time, by virtue of transistor 19, the base current of which is set by resistor 20, transistor 21 will also be turned off. The current flowing in resistor 22, along with any current that may be supplied by transistor 26, will then flow into the base of transistor 23 which is Darlington coupled to transistor 24 to create pull up 14. Since the Darlington pair has a very high composite Beta or current gain, pull up device 14 will act to pull terminal 11 towards $+V_{cc}$. Resistor 25 is present to limit the maximum pull up current.

When input terminal 12 drives the emitters of transistors 16 and 19 high via buffer 18, their emitter-base junctions are turned off. Since both of these devices are shown as non saturating by virtue of the symbol and in Schottky devices this is accomplished by a Schottky clamp diode connected from base to collector. Therefore inverse transistor action in transistors 16 and 19 is avoided and resistors 17 and 20 will force current into the bases of transistors 15 and 21 respectively via the Schottky clamp diodes. Transistor 15 will thus pull terminal 11 down to its equivalent of $V_{SAT}$ and transistor 21 will pull the base of transistor 23 low so as to turn it, and thereby pull up 14, off. Resistor 29 is present so that when transistor 23 is turned off the base of transistor 24 will be pulled low so as to turn it off. Thus, in effect, transistor 21 acts as an inverter to drive pull up 14. This alternate, or phase inverted driving, of pull up 14 and transistor 15 is referred to as totem pole operation.

The operation thus far has assumed that terminal 13 is high so as to invoke totem pole operation. This turns off transistor 26 so that current flowing in resistor 27 flows (via the Schottky clamp diode of transistor 26) in parallel with the current in resistor 22 into the base of transistor 23 (if transistor 21 is off) so as to turn pull up 14 on. However, when transistor 21 is on this current will flow into its collector. Thus pull up 14 is driven from input 12 in the opposite phase with respect to transistor 15. When terminal 13 is low the emitter of transistor 26 will be low and it will be driven towards saturation by the current in resistor 27. This will pull the base of transistor 23 low so as to turn it off thus disabling the pull up 14. From the above it is clear that the open collector or totem-pole modes are selectable by the logic state at terminal 13.

The above-described circuit involves 7 transistors and 6 resistors in addition to buffers 18 and 28. In the totem-pole mode it can be seen that pull up 14 is driven through two stages whereas transistor 15 is driven by one. Clearly the added stage will result in a signal propagation delay. Thus when input terminal 12 is going from a logic zero to a logic one there will be a transient period where transistor 15 is turned on before pull up 14 is turned off. This results in an output current spike that can adversely affect the $+V_{cc}$ line level. It would be desirable to reduce or eliminate this spike. It would also be desirable to reduce the component count and simplify the circuit and its design.

The circuit of FIG. 1 is also wasteful of current; it can be seen that the currents flowing in resistors 17, 20, 22, and 27 always flow regardless of logic or enable states. While the use to which these currents are put may switch or change they are always on. This characteristic could be improved.

DESCRIPTION OF THE INVENTION

FIG. 2 is a schematic diagram of the circuit of the invention. Where similar parts are employed, the designations of FIG. 1 are employed. Output transistor 15 and pull up 14 are identical. However the driver and control circuits are substantially different. It is to be understood that while the circuit shown employs Schottky logic levels and devices it could be fabricated using other standard bipolar devices.

Input terminal 12 via buffer 18 drives the base of transistor 30 which is operated as a two output driver. Transistor 30 has two outputs, one from the emitter which is in phase with the input signal at its base, and one from the collector which is 180° out of phase. The emitter signal is directly coupled to the base of output transistor 15. The collector signal is directly coupled (through resistor 33) to the base of transistor 23. For a logic one at terminal 12 the base of transistor 30 will be at its conduction threshold level of $2V_{BE}$ and it will conduct so as to pull the base of transistor 15 up and turn it on. For this condition the voltage drop across resistor 32 will lower the voltage at the base of transistor 23 to turn if off. Thus terminal 11 will be at the $V_{SAT}$ of transistor 15 and pull up 14 will be off.

For a logic zero at terminal 12 transistor 30 will be off and resistor 31 will pull the base of transistor 15 low so as to turn it off. The current conducted by series resistors 32 and 33 will flow into the base of transistor 23 thus turning pull up 14 on. For this state pull up 14 will pull terminal 11 up toward $+V_{cc}$. As was the case for FIG. 1 resistor 25 will limit the maximum current flowing in pull up 14. This totem-pole mode of operation assumes no current in transistor 34 which will occur, via inverter 35, when enable terminal 13 is high.

When terminal 13 goes low, the base of transistor 34 goes high. Since the threshold of conduction for transistor 34 is only $2V_{BE}$ it will turn on and pull the base of transistor 23 low so as to turn pull up 14 off. With transistor 30 turned off, all of the current flowing in resistor 32 will flow into the collector of transistor 34 via resistor 33. The potential at the base of transistor 23 will be $V_{BE}+V_{SAT}$ which is low enough to keep pull up 14 off.

When transistor 30 is turned on along with transistor 34 it can be seen that both ends of resistor 33 will be at $V_{BE}+V_{SAT}$. Thus there will be no voltage drop across resistor 33 and no current will flow in it. All of the current flowing in resistor 32 will flow through transistor 30 and serve as base current drive for transistor 15. This means that the drive to transistor 15 is relatively independent of the mode of output stage operation.

As a practical matter there will ordinarily be a small current flowing in resistor 33. But due to the circuit configuration, this current can easily be kept to below 10% of the resistor 32 current.

It can be seen that functionally the circuit of FIG. 2 performs as does FIG. 1 but uses fewer transistors (6 instead of 7) and fewer resistors (5 instead of 6). In addition, it can be seen that only one common stage exists between buffer 18 and the two halves of the totem pole circuit. Thus the propagation is faster and the propagation delay difference is substantially lower so that supply current spikes are lessened. The current applied to pull up 14 is determined solely by resistors 32 and 33. This substantially simplifies the circuit design and the overall circuit configuration enables a more efficient uses of IC chip area. Finally, the circuit is also current efficient because the current flowing in resistor 32 is switched between the base of transistor 15 (when transistor 30 is on) and the pull up device 14 (when transistor 30 is off). In this prior art circuit there are separate currents for pull up device 14 and transistor 15 which are always flowing but switched to select the conducting and non conducting states.

The circuit of the invention has been described and its behavior compared with the closest known prior art circuit. When a person skilled in the art reads the foregoing description, alternatives and equivalents, that are within the spirit and intent of the invention, will become apparent. Accordingly it is intended that the scope of the invention be limited only by the following claims.

I claim:
1. A digital driver circuit capable of driving an output terminal in response to an input terminal logic level in either an open transistor collector driver state or in a totem-pole driver state as determined by an enable terminal logic level, said circuit comprising:
   first and second supply terminals connectable to a source of operating power;
   first transistor means having an emitter coupled to said second terminal, a collector coupled to said output terminal, and a base;
   second transistor means having an emitter coupled to said output terminal, a collector coupled to said first supply terminal, and a base;
   a two output driver having an input driven from said input terminal and two out of phase output terminals coupled respectively to said base of said first transistor means and to said base of said second transistor means; and
   third transistor means having an emitter coupled to said second supply terminal by means of a diode that is forward biased when said third transistor means is rendered conductive, a collector coupled to said base of said second transistor means and a base coupled to said enable terminal whereby when said logic signal at said enable terminal turns said third transistor means on said second transistor means is turned off and said circuit operates in the open transistor collector mode and when said enable terminal logic state turns said third transistor means off said second transistor means is operative and said circuit operates in said totem-pole mode.
2. The circuit of claim 1 wherein said second transistor means comprise a pair of transistors Darlington connected to provide single base collector and emitter electrode terminals.
3. The circuit of claim 2 wherein said pair of transistors Darlington connected include first resistor means coupled between said second supply terminal and the base of the output element of said pair.

4. The circuit of claim 1 wherein said two output driver comprises fourth transistor means having an emitter coupled through a second resistor to said second supply terminal and to said base of said first transistor means, a collector coupled through a third resistor to said first supply terminal and to said base of said second transistor means and a base driven from the logic signal at said input terminal.

5. The circuit of claim 4 wherein said second transistor means collector is coupled to said first supply terminal by a fourth resistor.

6. The circuit of claim 4 wherein said collector of said fourth transistor means is coupled to said base of said second transistors means by way a fifth resistor whereby conduction of said third transistor means will disable and second transistor means and whereby when said third and fourth transistor means are both rendered conductive the voltage drop across said fifth resistor is reduced to a very low value so that the current in said third resistor flows substantially entirely in said fourth transistor means.

* * * * *